US009806593B2

(12) United States Patent
Nakayama et al.

(10) Patent No.: US 9,806,593 B2
(45) Date of Patent: Oct. 31, 2017

(54) DRIVE CIRCUIT OF POWER SEMICONDUCTOR DEVICE

(75) Inventors: Yasushi Nakayama, Tokyo (JP);
Ryosuke Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 182 days.

(21) Appl. No.: 13/059,429

(22) PCT Filed: Jul. 22, 2009

(86) PCT No.: PCT/JP2009/003419
§ 371 (c)(1),
(2), (4) Date: May 3, 2011

(87) PCT Pub. No.: WO2010/021082
PCT Pub. Date: Feb. 25, 2010

(65) Prior Publication Data
US 2011/0204929 A1    Aug. 25, 2011

(30) Foreign Application Priority Data

Aug. 21, 2008  (JP) .................................. 2008-212614

(51) Int. Cl.
*H02M 1/08* (2006.01)
*H03K 17/0812* (2006.01)
*H03K 17/06* (2006.01)

(52) U.S. Cl.
CPC ........ *H02M 1/08* (2013.01); *H03K 17/08128* (2013.01); *H03K 2017/066* (2013.01); *H03K 2217/0081* (2013.01)

(58) Field of Classification Search
CPC .. H02M 1/08; H03K 17/063; H03K 2017/066
(Continued)

(56) References Cited

U.S. PATENT DOCUMENTS 3,819,952 A * 6/1974 Enomoto et al. ............... 361/56
4,492,883 A * 1/1985 Janutka ......................... 327/377
(Continued)

FOREIGN PATENT DOCUMENTS

JP    63 99616    4/1988
JP    1 300617    12/1989
(Continued)

OTHER PUBLICATIONS

International Search Report dated Oct. 6, 2009 in PCT/JP09/003419 filed Jul. 22, 2009.
(Continued)

*Primary Examiner* — Lincoln Donovan
*Assistant Examiner* — Colleen O Toole
(74) *Attorney, Agent, or Firm* — Oblon, McClelland, Maier & Neustadt, L.L.P.

(57) ABSTRACT

In order to obtain a drive circuit of a power semiconductor device capable of making a fast response to a voltage fluctuation dV/dt and preventing a malfunction of the power semiconductor device while suppressing power consumption with a simple circuit configuration, a control circuit controlling ON and OFF switching of the power semiconductor device, a DC power supply supplying a voltage between control terminals of the power semiconductor device, and a switching element connected between the control terminals of the power semiconductor device are provided. The switching element turns ON in a case where a power supply voltage of the DC power supply drops or in a case where the voltage between the control terminals of the power supply device increases in a state where the power supply voltage of the DC power supply has dropped, and thereby causes a short-circuit between the control terminals of the power semiconductor device.

6 Claims, 4 Drawing Sheets

(58) Field of Classification Search
USPC ........ 327/108–112, 379, 380, 381, 389, 427, 327/430, 434
See application file for complete search history.

(56) References Cited

U.S. PATENT DOCUMENTS

| | | | | |
|---|---|---|---|---|
| 4,691,129 | A * | 9/1987 | Einzinger et al. | 327/434 |
| 4,748,351 | A * | 5/1988 | Barzegar | 327/384 |
| 4,804,866 | A | 2/1989 | Akiyama | |
| 4,873,202 | A | 10/1989 | Akiyama | |
| 4,970,420 | A * | 11/1990 | Billings | 327/430 |
| 5,986,484 | A * | 11/1999 | Kimata | 327/108 |
| 6,331,794 | B1 * | 12/2001 | Blanchard | 327/112 |
| 2009/0079491 | A1 | 3/2009 | Kawamura | |

FOREIGN PATENT DOCUMENTS

| | | |
|---|---|---|
| JP | 1-300617 | 12/1989 |
| JP | 6-77797 | 3/1994 |
| JP | 7-15949 | 1/1995 |
| JP | 10 257755 | 9/1998 |
| JP | 10-257755 A | 9/1998 |
| JP | 10 285909 | 10/1998 |
| JP | 10-285909 A | 10/1998 |
| JP | 2006 157367 | 6/2006 |
| JP | 2008-182884 | 8/2008 |
| JP | 2009 81962 | 4/2009 |

OTHER PUBLICATIONS

Office Action dated Feb. 19, 2013 in Japanese Patent Application No. 2010-525568 with partial English language translation.
Japanese Office Action dated Apr. 1, 2014, in Japan Patent Application No. 2013-087701 (with English translation).
Office Action dated Jan. 13, 2015 in Japanese Patent Application No. 2013-087701 (with English-language Translation).
Supplementary European Search Report dated Dec. 5, 2014, in European Patent Application No. 09808018.7.
Office Action dated Sep. 15, 2015 in Japanese Patent Application No. 2013-087701 (with English-language Translation).

* cited by examiner

[FIG.1]
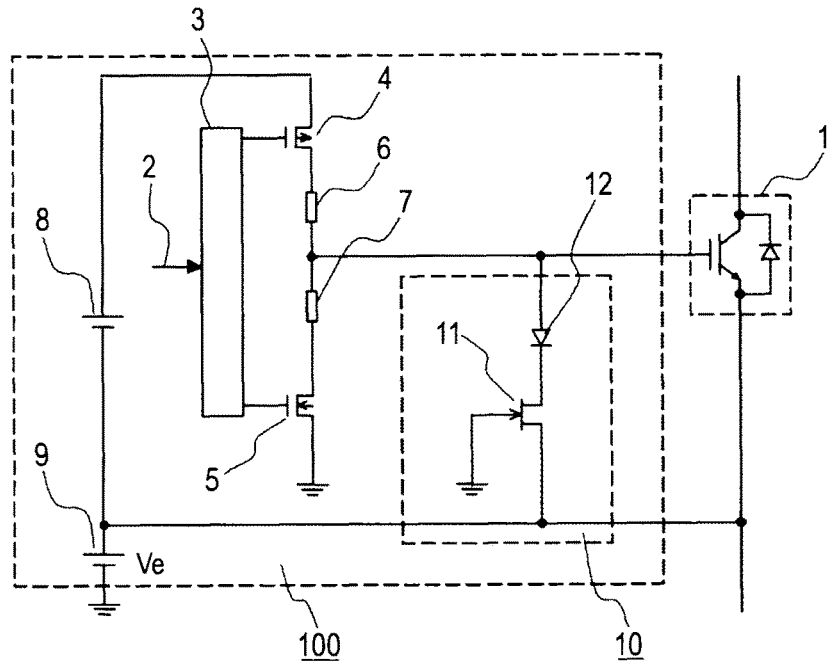
[FIG.2]
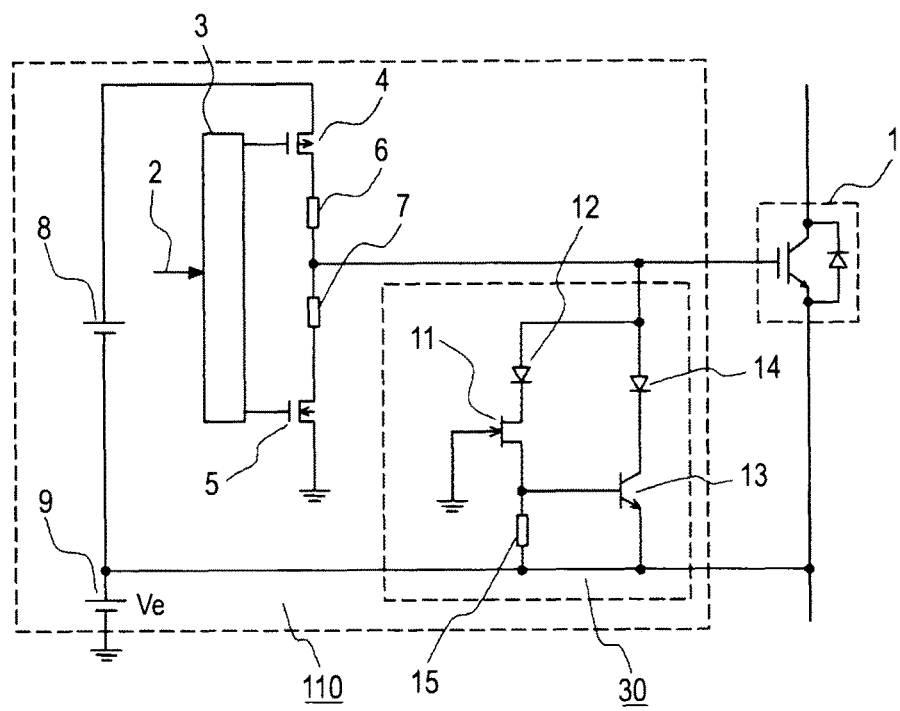

[FIG.3]
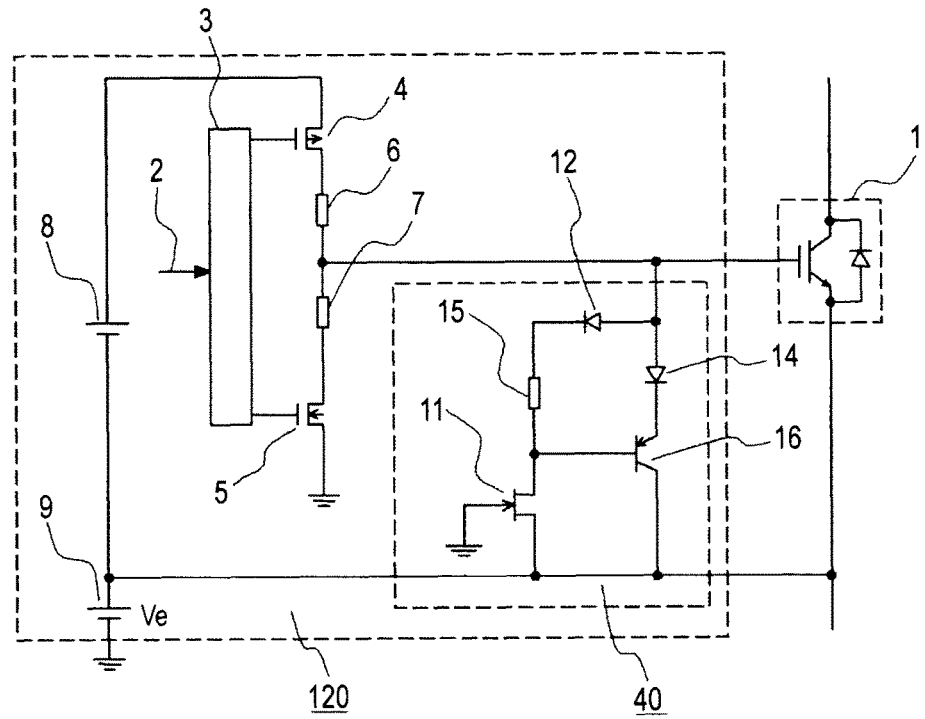
[FIG.4]
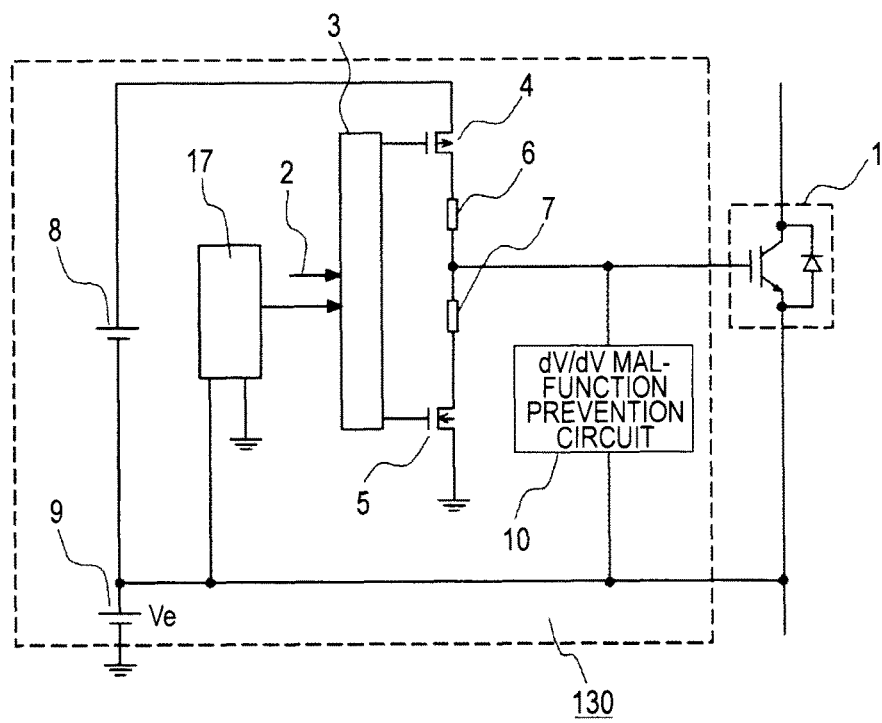

[FIG.5]
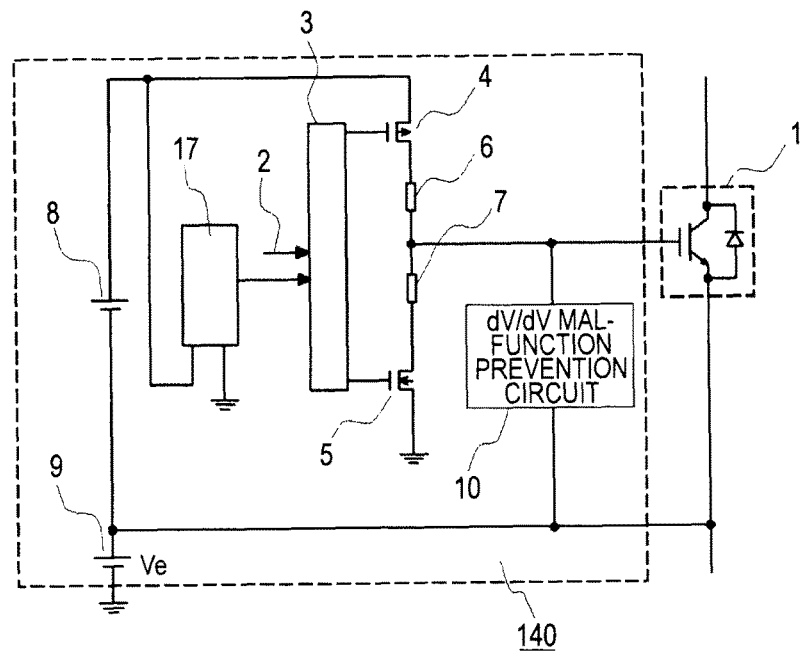
[FIG.6]
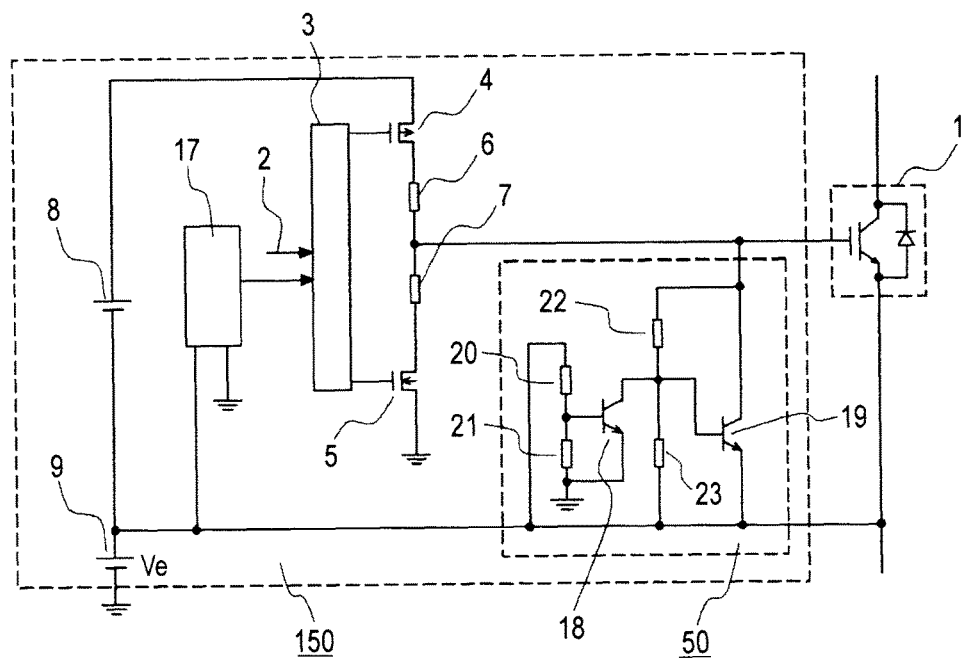

[FIG.7]
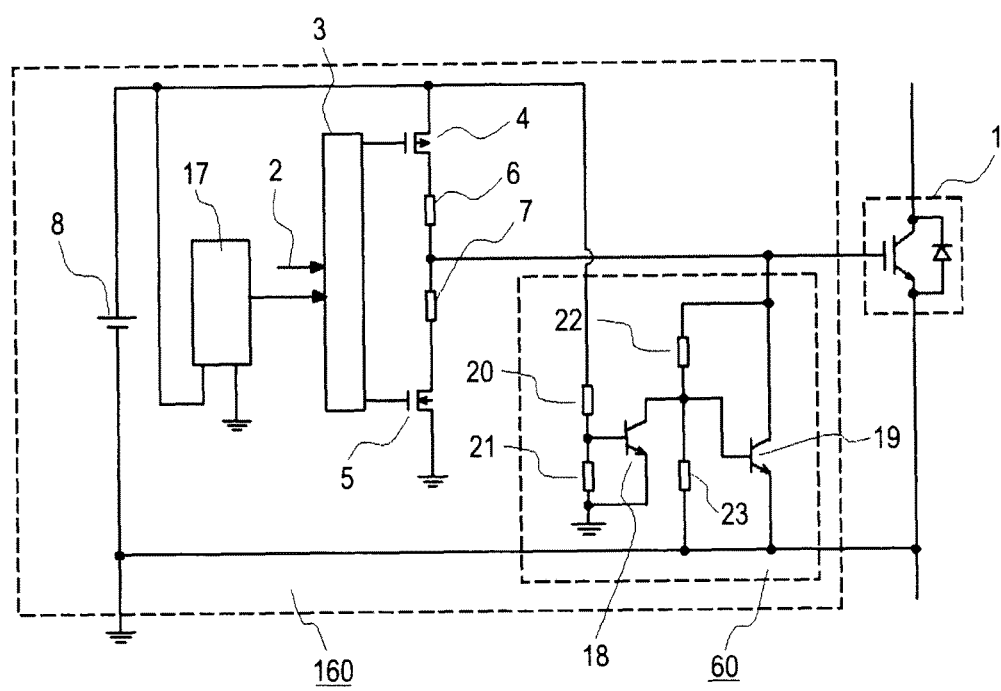

DRIVE CIRCUIT OF POWER SEMICONDUCTOR DEVICE

TECHNICAL FIELD

The present invention relates to a drive circuit of a power semiconductor device, and more particularly, to a drive circuit of a power semiconductor device with a capability of preventing the power semiconductor device from malfunctioning due to a voltage fluctuation dV/dt.

BACKGROUND ART

In a case where a power semiconductor device of a self turn-off type, such as an IGBT (Insulated Gate Bipolar Transistor), is used in a drive circuit of a power semiconductor device in the related art, when a voltage fluctuation dV/dt is applied between the collector and the emitter of the power semiconductor device, a gate voltage increases due to a parasitic capacity accompanying the gate of the power semiconductor device. When the gate voltage exceeds a predetermined threshold voltage, the power semiconductor device turns ON erroneously and an arm short-circuit occurs, which gives rise to a problem that the power semiconductor device breaks. In order to avoid this problem, there is a method of applying a negative voltage between the gate and the emitter while the power semiconductor device is in an OFF state. According to this method, however, when a voltage of the voltage fluctuation dV/dt is applied in a state where a power supply voltage of a gate drive circuit is not established, the power semiconductor device may possibly malfunction in a switching operation.

For a drive circuit of self-feeding type that supplies drive power of the semiconductor device from a main circuit of a power converter, there is a method of preventing the semiconductor device from malfunctioning in a switching operation since the main power supply is turned ON until the power supply voltage of the gate drive circuit is established. To be more concrete, a resistor and a P-channel FET (Field Effect Transistor) or an N-channel FET are connected between the gate and the emitter of the semiconductor device in the gate drive circuit. In a case where the gate voltage increases before the power supply voltage of the gate drive circuit rises, an increase of the gate voltage is limited by turning ON the P-channel FET or the N-channel FET. A malfunction of the semiconductor device in a switching operation is thus prevented (see, for example, Patent Document 1)

PRIOR ART DOCUMENT

Patent Document

Patent Document 1: JP-A-10-285909

SUMMARY OF THE INVENTION

Problems that the Invention is to Solve

In the drive circuit of the power semiconductor device in the related art, because the P-channel FET or the N-channel FET is maintained in an OFF state after the power supply voltage of the gate drive circuit rises, it is necessary to keep a current flowing to the resistor at all times. This poses a problem that power consumption of the drive circuit increases. Also, it is necessary to include a level detection circuit to detect that the gate voltage has reached a predetermined level. Further, although it is not anticipated in Patent Document 1, in the event of a power failure while the drive circuit is in operation, a large voltage fluctuation dV/dt may possibly be applied to the power semiconductor device because of recovery of a free wheel diode. It is therefore necessary for the drive circuit to have a fast response capability to the voltage fluctuation dV/dt. In order to solve this problem, for example, a resistance value of the resistor connected to the N-channel FET may be reduced. This solution, however, has a problem that power consumption is increased further. It should be noted that Patent Document 1 describes the use of a normally-ON semiconductor device but fails to describe a specific circuit diagram.

The invention was devised to solve the problems discussed above and the invention is to obtain a drive circuit of a power semiconductor device of a simple circuit configuration with a capability of preventing a malfunction of the power semiconductor device by responding fast to a voltage fluctuation dV/dt while suppressing power consumption.

Means for Solving the Problems

A drive circuit of a power semiconductor device according to the invention includes: a control circuit that controls ON and OFF switching of the power semiconductor device; a DC power supply that supplies a voltage between control terminals of the power semiconductor device; and a switching element that is connected between the control terminals of the power semiconductor device, which is characterized in that the switching element turns ON in a case where a power supply voltage of the DC power supply drops or turns ON in a case where a voltage between the control terminals of the power semiconductor device increases in a state where the power supply voltage of the DC power supply has dropped, and thereby causes a short-circuit between the control terminals of the power semiconductor device.

Advantages of the Invention

With the drive circuit of the power semiconductor device of the invention, the switching element connected between the control terminals of the power semiconductor device turns ON in a case where the power supply voltage of the DC power supply drops or turns ON in a case where the voltage between the control terminals of the power semiconductor device increases in a state where the power supply voltage of the DC power supply has dropped, and thereby causes a short-circuit between the control terminals of the power semiconductor device. It thus becomes possible to prevent a malfunction of the power semiconductor device by responding fast to a voltage fluctuation dV/dt while suppressing power consumption with a simple circuit configuration.

BRIEF DESCRIPTION OF THE DRAWINGS

FIG. 1 is a circuit diagram showing the configuration of a drive circuit of a power semiconductor device according to a first embodiment of the invention;

FIG. 2 is a circuit diagram showing the configuration of a drive circuit of a power semiconductor device according to a second embodiment of the invention;

FIG. 3 is a circuit diagram showing the configuration of a drive circuit of a power semiconductor device according to a third embodiment of the invention;

FIG. 4 is a circuit diagram showing the configuration of a drive circuit of a power semiconductor device according to a fourth embodiment of the invention;

FIG. 5 is a circuit diagram showing the configuration of another drive circuit of a power semiconductor device according to the fourth embodiment of the invention;

FIG. 6 is a circuit diagram showing the configuration of a drive circuit of a power semiconductor device according to a fifth embodiment of the invention; and FIG. 7 is a circuit diagram showing the configuration of a drive circuit of a power semiconductor device according to a sixth embodiment of the invention.

MODES FOR CARRYING OUT THE INVENTION

First Embodiment

FIG. 1 is a circuit diagram showing the configuration of a drive circuit of a power semiconductor device according to a first embodiment to implement the invention. Referring to FIG. 1, a drive circuit 100 of a power semiconductor device includes a control circuit 3, an ON-MOSFET (Metal Oxide Semiconductor Field Effect Transistor) 4, an OFF-MOSFET 5, gate resistors 6 and 7, a first DC power supply 8, a second DC power supply 9, and a dV/dt malfunction prevention circuit 10. An IGBT 1, which is a power semiconductor device, is connected to the drive circuit 100. The IGBT 1 includes a parallel-connected diode.

The control circuit 3 controls ON and OFF switching of the IGBT 1, which is a power semiconductor device, and controls the ON-MOSFET 4 and the OFF-MOSFET 5 according to a control signal 2 from the outside. The ON-MOSFET 4 is connected to the gate of the IGBT 1 via the gate resistor 6 and the OFF-MOSFET 5 is connected to the gate of the IGBT 1 via the gate resistor 7. As the control circuit 3 turns ON the ON-MOSFET 4 and turns OFF the OFF-MOSFET 5, a charge and discharge current flows to the gate of the IGBT 1 via the gate resistor 6. The IGBT 1 is thus turned ON. On the contrary, as the control circuit 3 turns OFF the ON-MOSFET 4 and turns ON the OFF-MOSFET 5, a charge and discharge current flows to the gate of the IGBT 1 via the gate resistor 7. The IGBT 1 is thus turned OFF.

The first DC power supply 8 and the second DC power supply 9 form a DC power supply that supplies a voltage between the control terminals of the IGBT 1. The first DC power supply 8 supplies a positive voltage between the gate and the emitter, which is between the control terminals of the IGBT 1, while the IGBT 1 is in an ON state, and the second DC power supply 9 supplies a negative voltage between the gate and the emitter, which is between the control terminals of the IGBT 1, while the IGBT 1 is in an OFF state. Because the ON-MOSFET 4 is turned ON and the OFF-MOSFET 5 is turned OFF by the control circuit 3 while the IGBT 1 is in an ON state, a positive voltage is applied between the gate and the emitter of the IGBT 1 by a power supply voltage of the first DC power supply 8. The second DC power supply 9 is connected to the emitter of the IGBT 1 and because the ON-MOSFET 4 is turned OFF and the OFF-MOSFET 5 is turned ON by the control circuit 3 while the IGBT 1 is in an OFF state, a negative voltage −Ve is applied between the gate and the emitter of the IGBT 1 by a power supply voltage Ve of the second DC power supply 9.

The dV/dt malfunction prevention circuit 10 is connected between the gate and the emitter of the IGBT 1. The dV/dt malfunction prevention circuit 10 includes an n-channel JFET (Junction Field Effect Transistor) 11, which is a normally-ON element, and a diode 12 provided to prevent an inverse current from flowing from the emitter to the gate of the IGBT 1. The JFET 11 is a switching element connected between the gate and the emitter of the IGBT 1 (between the control terminals of the power semiconductor device). The gate (control terminal) of the JFET 11 is connected to the GND of the drive circuit 100, which is the negative electrode side of the second DC power supply 9. The source of the JFET 11 is connected to the emitter of the IGBT 1 and the drain of the JFET 11 is connected to the gate of the IGBT 1 via the diode 12. The diode 12 is connected to the JFET 11 in series and connected between the gate and the emitter of the IGBT 1. The anode of the diode 12 is connected to the gate of the IGBT 1 and the cathode of the diode 12 is connected to the JFET 11.

An operation of the drive circuit 100 will now be described. In a normal state, that is, in a state where a power supply voltage of the second DC power supply 9 is established, even in a case where a voltage fluctuation dV/dt is applied to the IGBT 1 during an OFF period of the IGBT 1, for example, by a recovery operation of the diode parallel-connected to the IGBT 1, the negative voltage −Ve is applied between the gate and the emitter of the IGBT 1. Accordingly, even when the gate-emitter voltage of the IGBT 1 increases, the gate-emitter voltage is suppressed to or below the threshold voltage of the IGBT 1. The IGBT 1 therefore does not turn ON erroneously. Also, the negative voltage −Ve is applied between the gate and the source of the JFET 11. Hence, by setting the absolute value |Vgs| of the threshold voltage Vgs(off) of the JFET 11 below the absolute value |Ve| of the negative voltage −Ve, the JFET 11 turns OFF and no current flows to the dV/dt malfunction prevention circuit 10. Consequently, no influences are given to a switching operation of the IGBT 1 in a normal state.

Meanwhile, in an abnormal state, that is, when the power supply voltage of the second DC power supply 9 drops due to a power failure or the like, the absolute value |Ve| of the negative voltage −Ve applied between the gate and the emitter of the IGBT 1 drops. When the absolute value |Ve| of the negative voltage −Ve drops below the absolute value |Vgs| of the threshold voltage Vgs(off) of the JFET 11, the JFET 11 turns ON. In short, the JFET 11 turns ON in a case where the power supply voltage of the second DC power supply 9, which is a DC power supply, drops. Consequently, the JFET 11 causes a short-circuit between the gate and the emitter of the IGBT 1. Hence, even when the voltage fluctuation dV/dt is applied to the IGBT 1 in this state, an increase of the gate voltage of the IGBT 1 is suppressed. It thus becomes possible to prevent a malfunction that the IGBT 1 turns ON erroneously.

For the drive circuit of the power semiconductor device of the invention, there is no need to provide a drive circuit or a power supply separately for the driving of the JFET 11. Hence, a malfunction of the IGBT 1 caused by the voltage fluctuation dV/dt can be suppressed with a simple circuit configuration. Also, because no current flows into the dV/dt malfunction prevention circuit 10 including the JFET 11 at a normal time, power consumption of the drive circuit 100 can be suppressed. Further, because the JFET 11 turns ON at a time point at which the absolute value |Ve| of the negative voltage −Ve drops below the absolute value |Vgs| of the threshold voltage Vgs (off) of the JFET 11 as the power supply voltage of the second DC power supply 9 drops, the fast response capability is satisfactory. Hence, not only at the start-up of the gate drive power supply in the IGBT 1, but also upon application of a large voltage fluctuation dV/dt caused by a recovery of the diode in the event of a power failure in an operation state, a malfunction of the IGBT 1 can be prevented.

The circuit configuration of the dV/dt malfunction prevention circuit 10 described in this embodiment is one example and it is sufficient to exert the capability of preventing a malfunction caused by a voltage fluctuation dV/dt. Accordingly, the JFET 11 may be used in a multi-parallel configuration or a current-limiting resistor having an impedance low enough not to cause a malfunction of the IGBT 1 even by an application of the voltage fluctuation dV/dt may be connected to the gate or drain of the JFET 11. In addition, the JFET 11 is used as a normally-ON element in this embodiment. However, because it is sufficient to exert the capability of a normally-ON element, the JFET 11 may be replaced, for example, by a depression MOSFET.

As has been described, it becomes possible to obtain a drive circuit of a power semiconductor device capable of making a fast response to a voltage fluctuation dV/dt and having a capability of preventing a malfunction of the power semiconductor device while suppressing power consumption with a circuit configuration as simple as connecting a normally-ON element between the gate and the emitter of the IGBT 1.

Second Embodiment

FIG. 2 is a circuit diagram showing the configuration of a drive circuit of a power semiconductor device according to a second embodiment to implement the invention. The drive circuit of the power semiconductor device of this embodiment is different from the counterpart in the first embodiment above in that a current-amplifying stage is provided to a dV/dt malfunction prevention circuit. The current-amplifying stage is an amplifier circuit that amplifies a source current of a JFET to make a current flowing to the dV/dt malfunction prevention circuit larger to address a case where a gate capacity of the power semiconductor device is large and a current capacity of the JFET, which is a normally-ON element, becomes insufficient. In FIG. 2, components labeled with the same reference numerals as those in FIG. 1 denote the same or equivalent components and this applies to the entire description. Also, the features of components in the entire description are illustrative only and the components are not limited to the description herein.

A dV/dt malfunction prevention circuit 30 of this embodiment is of a configuration same as that of the first embodiment above in that the gate of a JFET 11, which is a normally-ON element, is connected to the GND of a drive circuit 110 and that the drain of the JFET 11 is connected to the gate of an IGBT 1 via a diode 12. The dV/dt malfunction prevention circuit 30 additionally includes an npn transistor 13, a diode 14, and a resistor 15 that together form an amplifier circuit. The npn transistor 13 is a normally-OFF switching element that is connected between the gate and the emitter of the IGBT 1 and amplifies a current flowing to the JFET 11. The source of the JFET 11 is connected to the emitter of the IGBT 1 via the resistor 15. Also, the source of the JFET 11 is also connected to the base, which is a control terminal, of the current-amplifying npn transistor 13. The emitter of the npn transistor 13 is connected to the emitter of the IGBT 1 and the collector of the npn transistor 13 is connected to the gate of the IGBT 1 via the diode 14.

An operation of the drive circuit 110 will now be described. In a normal state, that is, in a state where a power supply voltage of the second DC power supply 9 is established, the JFET 11 is OFF and the npn transistor 13 turns OFF, too. Hence, no current flows into the dV/dt malfunction prevention circuit 30. In an abnormal state, that is, when the power supply voltage of the second DC power supply 9 drops due to a power failure or the like, the absolute value |Ve| of a negative voltage −Ve applied between the gate and the emitter of the IGBT 1 drops. When the absolute value |Ve| of the negative value −Ve drops below the absolute value |Vgs| of the threshold voltage Vgs (off) of the JFET 11, the JFET 11 turns ON. When a voltage fluctuation dV/dt is applied to the IGBT 1 in this state, a gate voltage of the IGBT 1 increases and a current flows to the base of the npn transistor 13. The npn transistor 13 thus turns ON. In other words, the npn transistor 13 turns ON in a case where the gate voltage, which is a voltage between the control terminals of the IGBT 1, increases in a state where the power supply voltage of the second DC power supply 9, which is a DC power supply, has dropped. Accordingly, a short-circuit occurs between the gate and the emitter of the IGBT 1 and an increase of the gate voltage of the IGBT 1 is suppressed. It thus becomes possible to prevent a malfunction that the IGBT 1 turns ON erroneously.

By providing the npn transistor 13, a current flowing to the dV/dt malfunction prevention circuit 30 is amplified in comparison with a current flowing to the dV/dt malfunction prevention circuit 10 described in the first embodiment 1 above. Hence, even in a case where the gate capacity of the IGBT 1 is large, it becomes possible to prevent a malfunction of the IGBT 1. It should be noted that, as in the first embodiment above, it is necessary to set the absolute value |Vgs| of the threshold Vgs(off) of the JFET 11 below the absolute value |Ve| of the negative voltage −Ve at a normal time. However, because a base-emitter voltage Vbe on which the npn transistor 13 turns ON is also applied to the source of the JFET 11 in this embodiment, the absolute value |Vbe| of the base-emitter voltage Vbe of the npn transistor 13 is set below the absolute value |Vgs| of the threshold Vgs(off) of the JFET 11.

In this embodiment, the npn transistor 13 is used as a current-amplifying transistor. However, an n-channel MOSFET can be used as well. In this case, the absolute value |Vth| of a gate-source threshold voltage Vth of the MOSFET is set below the absolute value |Vgs| of the threshold value Vgs(off) of the JFET 11. The configuration of the dV/dt malfunction prevention circuit 30 described in this embodiment is one example to amplify a source current of the JFET 11 and it is sufficient for a dV/dt malfunction prevention circuit to exert its capability. Accordingly, the JFET 11 or the npn transistor 13 may be used in a multi-parallel configuration depending on a necessary current capacity or the npn transistor 13 may be connected by Darlington connection. Alternatively, a current-limiting resistor may be connected to the gate or drain of the JFET 11 or the collector or base of the npn transistor 13.

With the configuration described above, a current is amplified by the npn transistor 13 or the like in comparison with a case where the JFET 11 alone, which is a normally-ON element, is connected between the gate and the emitter of the IGBT 1. Hence, even in a case where a capacity of the control terminal (gate terminal) of the IGBT 1 is large and a current capacity becomes insufficient with the JFET 11 alone, it becomes possible to prevent a malfunction that the IGBT 1 turns ON erroneously.

Third Embodiment

FIG. 3 is a circuit diagram showing the configuration of a drive circuit of a power semiconductor device according to a third embodiment to implement the invention. The drive circuit of the power semiconductor device of this embodiment is different from the counterpart in the second embodiment above in that a dV/dt malfunction prevention circuit includes a pnp transistor as a current-amplifying transistor. A current-amplifying pnp transistor 16, a diode 14, and a resistor 15 that together form an amplifier circuit are provided to a dV/dt malfunction prevention circuit 40.

In the dV/dt malfunction prevention circuit 40 of this embodiment, the gate of the JFET 11, which is a normally-ON element, is connected to the GND of a drive circuit 120, the source of the JFET 11 is connected to the emitter of the IGBT 1, and the drain of the JFET 11 is connected to the gate of the IGBT 1 via the resistor 15 and a diode 12. The drain of the JFET 11 is also connected to the base, which is a control terminal, of the pnp transistor 16. The pnp transistor 16 is a normally-OFF switching element that is connected between the gate and the emitter of the IGBT 1 and amplifies a current flowing to the JFET 11. The emitter of the pnp transistor 16 is connected to the gate of the IGBT 1 via the diode 14 and the collector of the pnp transistor 16 is connected to the emitter of the IGBT 1.

In this embodiment, the anode of the diode 12 is connected to the gate of the IGBT 1. However, the anode of the diode 12 may be connected to the positive electrode side of the first DC power supply 8 or the resistor 15 may be connected to the positive electrode side of the first DC power supply 8 without providing the diode 12. Also, the collector of the pnp transistor 16 is connected to the emitter of the IGBT 1. However, the collector of the pnp transistor 16 may be connected to the GND of the drive circuit 120.

An operation of the drive circuit 120 will now be described. In a normal state, that is, in a state where a power supply voltage of the second DC power supply 9 is established, the JFET 11 is OFF and the pnp transistor 16 turns OFF, too. Hence, no current flows into the dV/dt malfunction prevention circuit 40. In an abnormal state, that is, when the power supply voltage of the second DC power supply 9 drops due to a power failure or the like, the absolute value |Ve| of a negative voltage −Ve applied between the gate and the emitter of the IGBT 1 drops. When the absolute value |Ve| of the negative voltage −Ve drops below the absolute value |Vgs| of the threshold voltage Vgs(off) of the JFET 11, the JFET 11 turns ON. When a voltage fluctuation dV/dt is applied to the IGBT 1 in this state, a gate voltage of the IGBT 1 increases and a current flows to the base of the pnp transistor 16. The pnp transistor 16 thus turns ON. In other words, the pnp transistor 16 turns ON in a case where the gate voltage, which is a voltage between the control terminals of the IGBT 1, increases in a state where the power supply voltage of the second DC power supply 9, which is a DC power supply, has dropped. Accordingly, a short-circuit occurs between the gate and the emitter of the IGBT 1 and an increase of the gate voltage of the IGBT 1 is suppressed. It thus becomes possible to prevent a malfunction that the IGBT 1 turns ON erroneously.

By providing the pnp transistor 16, a current flowing to the dV/dt malfunction prevention circuit 40 is amplified in comparison with a current flowing to the dV/dt malfunction prevention circuit 10 described in the first embodiment above. Hence, even in a case where a gate capacity of the IGBT 1 is large, a malfunction of the IGBT 1 can be prevented.

The merit of using the pnp transistor 16 instead of an npn transistor as a current-amplifying transistor will now be described. In a case where an npn transistor (or a p-channel MOSFET) is used as in the second embodiment above, a base-emitter voltage of the npn transistor is also applied between the source and the gate of the JFET 11. It is therefore necessary to set the absolute value |Vgs| of the threshold value Vgs (off) of the JFET 11 above the absolute value |Vbe| of the base-emitter voltage Vbe of the npn transistor 13 or the absolute value |Vth| of the gate-source threshold voltage Vth of the MOSFET. However, in a case where the pnp transistor 16 is used as in this embodiment, a voltage applied between the gate and the source of the JFET 11 is only the negative voltage −Ve by the power supply voltage of the second DC power supply 9. Hence, it is not necessary to set the absolute value |Vgs| of the threshold voltage Vgs(off) of the JFET 11 above the absolute value |Vbe| of the base-emitter voltage Vbe of the npn transistor 13 or the absolute value |Vth| of the gate-source threshold voltage Vth of the MOSFET. It is therefore sufficient to merely set the absolute value |Vgs| of the threshold voltage Vgs (off) of the JFET 11 below the absolute value |Ve| of the negative voltage −Ve for the negative voltage −Ve by the power supply voltage of the second DC power supply 9 at a normal time. Accordingly, the threshold can be set in a broad range.

The configuration of the dV/dt malfunction prevention circuit 40 described in this embodiment is one example to amplify a source current of the JFET 11 and it is sufficient for a dV/dt malfunction prevention circuit to exert its capability. Accordingly, the JFET 11 or the pnp transistor 16 may be used in a multi-parallel configuration or the pnp transistor 16 may be connected by Darlington connection. Alternatively, a current-limiting resistor may be connected to the gate or drain of the JFET 11 or the collector or base of the pnp transistor 16.

According to the configuration described above, a current is amplified by the pnp transistor 16 or the like in comparison with a case where the JFET 11 alone, which is a normally-ON element, is connected between the gate and the emitter of the IGBT 1. Hence, even in a case where a capacity of the control terminal (gate terminal) of the IGBT 1 is large and a current capacity becomes insufficient with the JFET 11 alone, it becomes possible to prevent a malfunction that the IGBT 1 turns ON erroneously.

Fourth Embodiment

FIG. 4 is a circuit diagram showing the configuration of a power semiconductor device according to a fourth embodiment to implement the invention. The drive circuit of the power semiconductor device of this embodiment is different from the counterpart in the first embodiment above in that it includes a power supply voltage detection circuit.

In the first through third embodiments above, in a case where a power supply voltage of the DC power supply inside the drive circuit drops due to a power failure or the like, a malfunction that the IGBT 1 turns ON erroneously is prevented by causing a short-circuit between the gate and the emitter of the IGBT 1 using a JFET, a transistor, or a MOSFET. However, the power supply voltage of the DC power supply may possibly drop in the event of a power failure or the like while the IGBT 1 is in an ON state. In this case, when a dV/dt malfunction prevention circuit operates before the IGBT 1 is turned OFF via a gate resistor, a short-circuit occurs between the gate and the emitter of the IGBT 1. Hence, there is a possibility of a problem that the IGBT 1 turns OFF abruptly. Such abrupt turning-OFF of the IGBT 1 may be avoided by providing a limiting resistor to the dV/dt malfunction prevention circuit. However, in a case where a large voltage fluctuation dV/dt is applied, an operation of the dV/dt malfunction prevention circuit may possibly become late. Such being the case, the drive circuit of the power semiconductor device of this embodiment is additionally furnished with a capability of turning OFF the IGBT 1 normally before the dV/dt malfunction prevention circuit operates.

Referring to FIG. 4, a drive circuit 130 of a power semiconductor device is the same as the drive circuit 100 of the power semiconductor device described in the first embodiment above except that it additionally includes a power supply voltage detection circuit 17. A dV/dt malfunction prevention circuit other than those described in the first through third embodiments above, for example, a circuit that does not use a normally-ON element but uses a normally-OFF element is still able to exert the capability of avoiding abrupt tuning-OFF of the IGBT as long as it has a capability of suppressing an increase of the gate voltage of the IGBT in a state where the power supply voltage of the DC power supply has dropped.

The power supply voltage detection circuit 17 is formed, for example, of a comparator and connected to the positive electrode side of the second DC power supply 9 to detect a power supply voltage of the second DC power supply 9. A voltage detection level of the power supply voltage detection circuit 17 is set so that a voltage drop is detected at a time point at which the power supply voltage of the second DC power supply 9 has dropped by ΔV. Herein, ΔV is a predetermined power supply voltage drop amount to be detected by the power supply voltage detection circuit 17. Also, the voltage detection level of the power supply voltage detection circuit 17 is set higher than a voltage on which the dV/dt malfunction prevention circuit 10 starts to operate. When the power supply voltage of the second DC power supply 9 drops to or below the voltage detection level, that is, when the power supply voltage of the second DC power supply 9 reaches the predetermined power supply voltage drop amount, the power supply voltage detection circuit 17 outputs an OFF signal to the control circuit 3. The control circuit 3 then turns OFF the IGBT 1 or controls the ON-MOSFET 4 or the OFF-MOSFET 5 to maintain an OFF state of the IGBT 1. Owing to these operations, even in a case where the power supply voltage of the second DC power supply 9 drops due to a power failure or the like, it becomes possible to turn OFF the IGBT 1 normally before the dV/dt malfunction prevention circuit 10 operates.

The setting of the voltage detection level of the power supply voltage detection circuit 17, "Ve−ΔV", in a case where the dV/dt malfunction prevention circuit described in the first embodiment above is used will now be described. The voltage detection level is set so that the absolute value |Ve−ΔV| of the voltage detection level of the power supply voltage detection circuit 17, "Ve−ΔV", satisfies the relation, |Ve−ΔV|>|Vgs|, for the absolute value |Vgs| of the threshold voltage Vgs(off) of the JFET 11. Herein, a difference between the power supply voltage Ve and the threshold voltage Vgs (off) on which the JFET 11, which is a switching element, turns ON, is the drop amount of the power supply voltage of the second DC power supply 9, on which the JFET 11 turns ON. In other words, to satisfy the relation, |Ve−ΔV|>|Vgs|, is equal to make the predetermined power supply voltage drop amount to be detected by the power supply voltage detection circuit 17 smaller than the drop amount of the power supply voltage of the second DC power supply 9, on which the JFET 11 turns ON.

By making the setting in this manner, in a case where the power supply voltage of the second DC power supply 9 drops while the IGBT 1 is in an ON state, the power supply voltage detection circuit 17 detects a drop in the power supply voltage of the second DC power supply 9 at a time point at which the power supply voltage of the second DC power supply 9 has dropped by ΔV from the normal value Ve. The power supply voltage detection circuit 17 then outputs an OFF command to the control circuit 3 and the control circuit 3 turns OFF the IGBT 1. At a time point at which the power supply voltage of the second DC power supply 9 has dropped to the threshold voltage Vgs (off) of the JFET 11, the JFET 11 becomes an ON state. Hence, even when a voltage fluctuation dV/dt is applied, an increase of the gate voltage of the IGBT 1 is suppressed.

The drive circuit 130 of the power semiconductor device of FIG. 4 has been described in a case where the power supply voltage detection circuit 17 detects a drop in the power supply voltage of the second DC power supply 9. However, as a drive circuit 140 of the power semiconductor device shown in FIG. 5, it may be configured in such a manner that the power supply voltage detection circuit 17 is connected to the positive electrode side of the first DC power supply 8 to detect a voltage drop in a sum of the power supply voltages of the first DC power supply 8 and the second DC power supply 9. In this case, too, the voltage detection level of the power supply voltage detection circuit 17 and a voltage on which the dV/dt malfunction prevention circuit 10 starts to operate (for example, the threshold voltage Vge (off) of the JFET 11) are set in such a manner that the dV/dt malfunction prevention circuit 10 does not operate before the IGBT 1 is turned OFF as the power supply voltage detection circuit 17 detects a voltage drop in the power supply voltage.

As is shown in FIG. 5, when a voltage detection is performed on the positive electrode side of the first DC power supply 8, it is not clear in which of the first DC power supply 8 and the second DC power supply 9 and in what ratio a power supply voltage drop is occurring. However, by setting the voltage detection level on the assumption that the power supply voltage of the second DC power supply 9 alone drops, it becomes possible to make the setting so that the dV/dt malfunction prevention circuit 10 does not operate first. For example, in a case where the power supply voltage of the second DC power supply 9 alone drops, the voltage detection level "Ve−ΔV" is set so as to satisfy the relation, |Ve−ΔV|>|Vgs|, so that the power supply voltage detection circuit 17 detects a voltage drop at a time point at which a sum of the power supply voltages of the first DC power supply 8 and the second DC power supply 9 has dropped by ΔV. There may be a case where a drop ratio of the first DC power supply 8 and the second DC power supply 9 determines in the event of a power failure for some types of DC power supply. In such a case, the setting range of the voltage detection level of the voltage detection circuit 17 and the threshold voltage Vgs(off) of the JFET 11 is broaden.

By additionally providing the power supply voltage detection circuit 17 described in this embodiment to the counterparts in the second and third embodiments above, it becomes possible to achieve an advantage of this embodiment in addition to the advantages described in the second and third embodiments above.

As has been described, the power supply voltage detection circuit 17 to detect a drop in the voltage supplied from at least one of the first DC power supply 8 and the second DC power supply 9 is included. Hence, even in a case where a power supply voltage of the DC power supply in the drive circuit 130 drops due to a power failure or the like during an ON period of the power semiconductor device, the power semiconductor device can be turned OFF normally by the power supply voltage detection circuit 17 before the switching element turns ON. It thus becomes possible to prevent the power semiconductor device from turning OFF fast.

Fifth Embodiment

FIG. 6 is circuit diagram showing the configuration of a drive circuit of a power semiconductor device according to a fifth embodiment to implement the invention. The drive circuit of the power semiconductor device of this embodiment is different from the counterpart in the fourth embodiment above in that a normally-OFF element is used instead of a normally-ON element in a dV/dt malfunction prevention circuit.

A dV/dt malfunction prevention circuit 50 using a normally-OFF element includes a first npn transistor 18, a second npn transistor 19, resistors 20 and 21 to divide a power supply voltage of the second DC power supply 9 and input the divided voltage between the base and the emitter of the first npn transistor 18, and resistors 22 and 23 connected in series between the gate and the emitter of the IGBT 1 in such a manner that the collector of the first npn transistor 18 and the base of the second npn transistor 19 are connected to the connection point thereof.

An operation of the drive circuit 150 will now be described. In a normal state, that is, in a state where a power supply voltage of the second DC power source 9 is established, a voltage obtained by dividing the power supply voltage of the second DC power supply 9 by the resistors 20 and 21 is applied between the base and the emitter of the first npn transistor 18. The first npn transistor 18 thus becomes an ON state. When the first npn transistor 18 becomes an ON state, the base voltage of the second npn transistor 19 becomes a voltage equivalent to the GND of the drive circuit 150. The second npn transistor 19 thus becomes an OFF state. Consequently, no influences are given to a normal switching operation of the IGBT 1.

In a case where the power supply voltage of the second DC power supply 9 drops due to a power failure or the like, because the voltage detection level of the power supply voltage detection circuit 17 is set above the threshold of the dV/dt malfunction prevention circuit 50, the power supply voltage detection circuit 17 operates first, so that the IGBT 1 turns OFF or an OFF state is maintained. When the power supply voltage of the second DC power supply 9 drops further, the base-emitter voltage of the first npn transistor 18 drops. The first npn transistor 18 thus turns OFF. When a voltage fluctuation dV/dt is applied in this state and the gate voltage of the IGBT 1 increases, a current flows to the base of the second npn transistor 19 via the resistor 22. The second npn transistor 19 thus turns ON. As the second npn transistor 19 turns ON, a short-circuit occurs between the gate and the emitter of the IGBT 1. An increase of the gate voltage of the IGBT 1 can be therefore suppressed. In other words, as with the fourth embodiment above, a predetermined power supply voltage drop amount to be detected by the power supply voltage detection circuit 17 is made smaller than a drop amount of the power supply voltage of the second DC power supply 9, on which the second npn transistor 19 turns ON in a case where the gate voltage, which is a voltage between the control terminals of the IGBT 1, increases.

There may be a case where an inverse current flows to the second npn transistor 19 depending on the characteristic and a circuit constant of the first and second npn transistors 18 and 19. In such a case, a diode preventing an inverse current is inserted between the second npn transistor 19 and the gate of the IGBT 1. The diode preventing an inverse current is inserted in such a manner that the cathode thereof is on the side of the second npn transistor 19.

The configuration of the dV/dt malfunction prevention circuit 50 described in this embodiment is one example and it is sufficient for a dV/dt malfunction prevention circuit to exert its capability. Accordingly, the second npn transistor 19 may be used in a multi-parallel configuration depending on a necessary current capacity or the second npn transistors 19 may be connected by Darlington connection. Alternatively, a current-limiting resistor may be connected to the gate or drain of the JFET 11 or the collector or base of the second npn transistor 19.

Also, according to this embodiment, the first npn transistor 18 is in an ON state at a normal time. Hence, a current keeps flowing to the resistor 22 when the IGBT 1 is also in an ON state. Accordingly, in order to suppress power consumption at the resistor 22, it is necessary to increase the resistance value of the resistor 22. Because a base current of the second npn transistor 19 consequently becomes smaller, it is effective to connect the second npn transistor 19 by Darlington connection. In addition, an npn transistor is used in this embodiment. However, an n-channel MOSFET may be used instead of the npn transistor.

FIG. 6 shows a case where the power supply detection circuit 17 detects a drop in the power supply voltage of the second DC power supply 9. However, it may be configured in such a manner that, as described in the fourth embodiment above, the power supply voltage detection circuit 17 is connected between the positive electrode side of the first DC power supply 8 and the GND of the drive circuit 150 to detect a voltage drop in a sum of the power supply voltages of the first DC power supply 8 and the second DC power supply 9. In this case, too, the voltage detection level of the power supply voltage detection circuit 17 and a voltage on which the dV/dt malfunction prevention circuit 50 starts to operate are set so that the dV/dt malfunction prevention circuit 50 does not operate before the IGBT 1 is turned OFF as the power supply voltage detection circuit 17 detects a voltage drop in the power supply voltage.

As has been described, because the first and second npn transistors 18 and 19, which are normally-OFF elements, are used in the dV/dt malfunction prevention circuit 50, it becomes possible to suppress a malfunction of the IGBT 1 with a simple circuit configuration. Also, by providing the power supply voltage detection circuit 17, even in a case where a power supply voltage of the DC power supply in the drive circuit 150 drops due to a power failure or the like during an ON period of the IGBT 1, the power semiconductor device can be turned OFF normally before the normally-OFF elements in the dV/dt malfunction prevention circuit 50 turn ON. It thus becomes possible to prevent the power semiconductor device from turning OFF fast.

Sixth Embodiment

FIG. 7 is a circuit diagram showing the configuration of a drive circuit of a power semiconductor device according to a sixth embodiment to implement the invention. The drive circuit of the power semiconductor device of this embodiment is different from the counterpart in the fifth embodiment above in that a DC power supply is formed of a first DC power supply alone that supplies a positive voltage between the gate and the emitter, which is between the control terminals of the IGBT 1. This embodiment is applied to a case where the power semiconductor device does not malfunction without having to apply a negative voltage between the gate and the emitter in an OFF state, such as a case where a voltage fluctuation dV/dt between the collector and the emitter is small.

In FIG. 7, the power supply voltage detection circuit 17 is connected to the positive electrode side of the first DC power supply 8 to detect a voltage drop of the first DC power supply 8. Also, the resistor 20 is connected not to the negative electrode side of the first DC power supply 8 but to the positive electrode side of the first DC power supply 8. A dV/dt malfunction prevention circuit 60 using a normally-OFF element includes a first npn transistor 18, a second npn transistor 19, resistors 20 and 21 to divide a power source voltage of the first DC power supply 8 and input the divided voltage between the base and the emitter of the first npn transistor 18, and resistors 22 and 23 connected in series between the gate and the emitter of the IGBT 1 in such a manner that the collector of the first npn transistor 18 and the base of the second npn transistor 19 are connected to the connection point thereof.

An operation of the drive circuit 160 will now be described. In a normal state, that is, in a state where a power supply voltage of the first DC power supply 8 is established, a voltage obtained by dividing the power supply voltage of the first DC power supply 8 by the resistors 20 and 21 is applied between the base and the emitter of the first npn transistor 18 via the resistor 20 connected to the positive electrode side of the first DC power supply 8. The first npn transistor 18 thus turns ON. By setting the collector-emitter voltage of the first npn transistor 18 below the base-emitter voltage on which the second npn transistor 19 turns ON, the second npn transistor 19 becomes an OFF state. Consequently, no influences are given to a normal switching operation of the IGBT 1.

In a case where the power supply voltage of the first DC power supply 8 drops due to a power failure or the like, because the voltage detection level of the power supply voltage detection circuit 17 is set above the threshold of the dV/dt malfunction prevention circuit 60, the power supply voltage detection circuit 17 operates first, so that the IGBT 1 turns OFF or an OFF state is maintained. When the power supply voltage of the first DC power supply 8 drops further, the base-emitter voltage of the first npn transistor 18 drops. The first npn transistor 18 thus turns OFF. When the gate voltage of the IGBT 1 increases as a voltage fluctuation dV/dt is applied in this state, a current flows to the base of the second npn transistor 19 via the resistor 22. The second npn transistor 19 thus turns ON. As the second npn transistor 19 turns ON, a short-circuit occurs between the gate and the emitter of the IGBT 1. It thus becomes possible to suppress an increase of the gate voltage of the IGBT 1.

There may be a case where an inverse current flows to the second npn transistor 19 depending on the characteristic and a circuit constant of the first and second npn transistors 18 and 19. In such a case, a diode preventing an inverse current is inserted between the second npn transistor 19 and the gate of the IGBT 1. The diode preventing an inverse current is inserted in such a manner that the cathode thereof is on the side of the second npn transistor 19.

The configuration of the dV/dt malfunction prevention circuit 60 described in this embodiment is one example and it is sufficient for a dV/dt malfunction prevention circuit to exert its capability. Accordingly, the second npn transistor 19 may be used in a multi-parallel configuration depending on a necessary current capacity or the second npn transistors 19 may be connected by Darlington connection. Alternatively, a current-limiting resistor may be connected to the gate or drain of the JFET 11 or the collector or base of the second npn transistor 19.

As has been described above, even when the DC power supply is formed of the first DC power supply 1 alone, because the first and second npn transistors 18 and 19, which are normally-OFF elements, are used in the dV/dt malfunction prevention circuit 60, a malfunction of the IGBT 1 can be suppressed with a simple circuit configuration. Also, by providing the power supply voltage detection circuit 17, even in a case where a power supply voltage of the DC power supply in the drive circuit 160 drops due to a power failure or the like during an ON period of the IGBT 1, the power semiconductor device can be turned OFF normally before the normally-OFF elements in the dV/dt malfunction prevention circuit 60 turn ON. It thus becomes possible to prevent the power semiconductor device from turning OFF fast.

In all the embodiments described above, an IGBT is used as the power semiconductor device. However, for example, the drive circuit of the power semiconductor device described in any of the embodiments above can be applied to a voltage-driven power semiconductor device, for example, a MOSFET. Also, the drive circuit described in any of the embodiments above can be applied not only to Si as a semiconductor but also to a wide-gap semiconductor, such as SiC. A wide-gap semiconductor, such as SiC, has a low threshold voltage Vth in some cases and it readily malfunctions. Accordingly, for a power semiconductor device fabricated using SiC or the like, the advantage of preventing a malfunction using the drive circuit described in any of the embodiments above is further greater.

DESCRIPTION OF REFERENCE NUMERALS AND SIGNS

1: IGBT (power semiconductor device)
2: control signal
3: control circuit
4: ON-MOSFET
5: OFF-MOSFET
6 and 7: gate resistor
8: first DC power supply
9: second DC power supply
10, 30, 40, 50, and 60: dV/dt malfunction prevention circuit
11: JFET
12 and 14: diode
13: npn transistor
15 and 20 through 23: resistor
16: pnp transistor
17: power supply voltage detection circuit
18: first npn transistor
19: second npn transistor
100, 110, 120, 130, 140, 150, and 160: drive circuit

The invention claimed is:
1. A drive circuit of a power semiconductor device, comprising:
  a control circuit that controls ON and OFF switching of the power semiconductor device;
  a transistor that turns ON and OFF the power semiconductor device on the basis of a signal from the control circuit;
  a DC power supply that supplies a voltage between control terminals of the power semiconductor device;
  a normally-ON element that is connected between the control terminals of the power semiconductor device not via the transistor that turns ON and OFF the power semiconductor device, a control terminal of the normally-ON device being fixedly connected to ground; and a diode that is connected in series with the normally-ON element between the control terminals of the power semiconductor device, the diode being directly connected to at least one of the control terminals of the power semiconductor device, wherein the DC power supply includes a first DC power supply that supplies a positive voltage between the control terminals of the power semiconductor device while the power semiconductor device is in an ON state, and a second DC power supply that is connected between a negative terminal of the power semiconductor device and ground and between a positive terminal of the normally-ON element and ground, the second DC power supply supplying a negative voltage to the negative terminal of the power semiconductor device and the negative terminal of the normally-ON element while the power semiconductor device is in an OFF state; and wherein the normally-ON element turns ON in a case where a power supply voltage of the second DC power supply that supplies the negative voltage to the negative terminal of the power semiconductor device drops below a predetermined value or turns ON in a case where a voltage between the control terminals of the power semiconductor device increases in a state where the power supply voltage of the second DC power supply that supplies the negative voltage to the negative terminal of the power semiconductor device has dropped, and thereby causes a short-circuit between the control terminals of the power semiconductor device.

2. The drive circuit of the power semiconductor device according to claim 1, further comprising:

an amplifier circuit that is connected between the control terminals of the power semiconductor device and amplifies a current flowing to the normally-ON element.

3. The drive circuit of the power semiconductor device according to claim 1, wherein the diode is connected such that an anode side thereof is on a gate terminal side of the power semiconductor device.

4. The drive circuit of the power semiconductor device according to claim 1, wherein an absolute value of a threshold voltage of the normally-ON element is set below an absolute value of the negative voltage of the second DC power supply at a normal time.

5. The drive circuit of the power semiconductor device according to claim 1, wherein the power semiconductor device is a wide-gap semiconductor.

6. The drive circuit of the power semiconductor device according to claim 1, wherein the diode is connected such that an anode side thereof is on a gate terminal side of the power semiconductor device and a cathode side thereof is connected to an emitter terminal of the normally-ON element.

* * * * *